United States Patent
Caldwell

(10) Patent No.: US 6,879,194 B1
(45) Date of Patent: Apr. 12, 2005

(54) APPARATUS AND METHOD FOR AN ACTIVE POWER-ON RESET CURRENT COMPARATOR CIRCUIT

(75) Inventor: Joshua William Caldwell, Tucson, AZ (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/648,530

(22) Filed: Aug. 25, 2003

(51) Int. Cl.[7] ............................................. H03L 7/00
(52) U.S. Cl. ................................................... 327/143
(58) Field of Search ................................. 327/142, 143, 327/198, 530, 534, 535, 538, 539, 543

(56) References Cited

U.S. PATENT DOCUMENTS

| | | | | |
|---|---|---|---|---|
| 4,697,097 A | * | 9/1987 | Rusznyak | ..................... 327/546 |
| 5,852,376 A | * | 12/1998 | Kraus | ........................... 327/143 |
| 5,883,532 A | * | 3/1999 | Bowers | ........................ 327/143 |
| 5,959,477 A | * | 9/1999 | Chung | .......................... 327/143 |
| 6,137,324 A | * | 10/2000 | Chung | .......................... 327/143 |

* cited by examiner

Primary Examiner—Jeffrey Zweizig
(74) Attorney, Agent, or Firm—Merchant & Gould P.C.; Joshua W. Korver

(57) ABSTRACT

An active power-on reset (POR) current comparator circuit creates a POR signal for resetting logic devices and masking reference startup signals during the initial power supply ramp of an integrated circuit. The comparator circuit provides a logic level signal (i.e., the POR signal) that will actuate when a bias current is above a predetermined level as compared to another current. The predetermined level for the bias current is set by a ratio established between two resistance levels within the active POR current comparator circuit.

20 Claims, 3 Drawing Sheets

APPARATUS AND METHOD FOR AN ACTIVE POWER-ON RESET CURRENT COMPARATOR CIRCUIT

FIELD OF THE INVENTION

The present invention relates to the field of power-on reset circuits, and in particular, to an apparatus and method for an active power-on reset current comparator circuit.

BACKGROUND OF THE INVENTION

Circuits often use a power-on reset (POR) signal for resetting the circuitry during power-up. As the bias current approaches a stable operating level, the POR signal is used to reset, or initialize, the circuitry. Circuits may also use a POR signal to disable certain circuits until a stable bias current signal is available. Using a POR signal ensures stable operation of the circuit until a stead-state is reached.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data signal.

The present invention relates to an active power-on reset (POR) current comparator circuit. The POR current comparator circuit compares the ratio of two currents. A first current is produced in response to a current proportional-to-absolute-temperature generator ($I_{PTAT}$ generator). The $I_{PTAT}$ current is determined according to a first resistance level. A second current is determined in response to the $I_{PTAT}$ current and a second resistance level. When compared, the first and second currents are related according to a scaling factor (e.g., N). The scaling factor may be selected such that the POR signal will de-assert at any selected point during startup. The present invention allows for the generation of a POR signal from a higher voltage supply (e.g., 40V) while using a minimum number of components. In previous applications, standard comparator circuits were used, but required additional circuitry to prevent breakdown at higher voltages.

Figure 1:
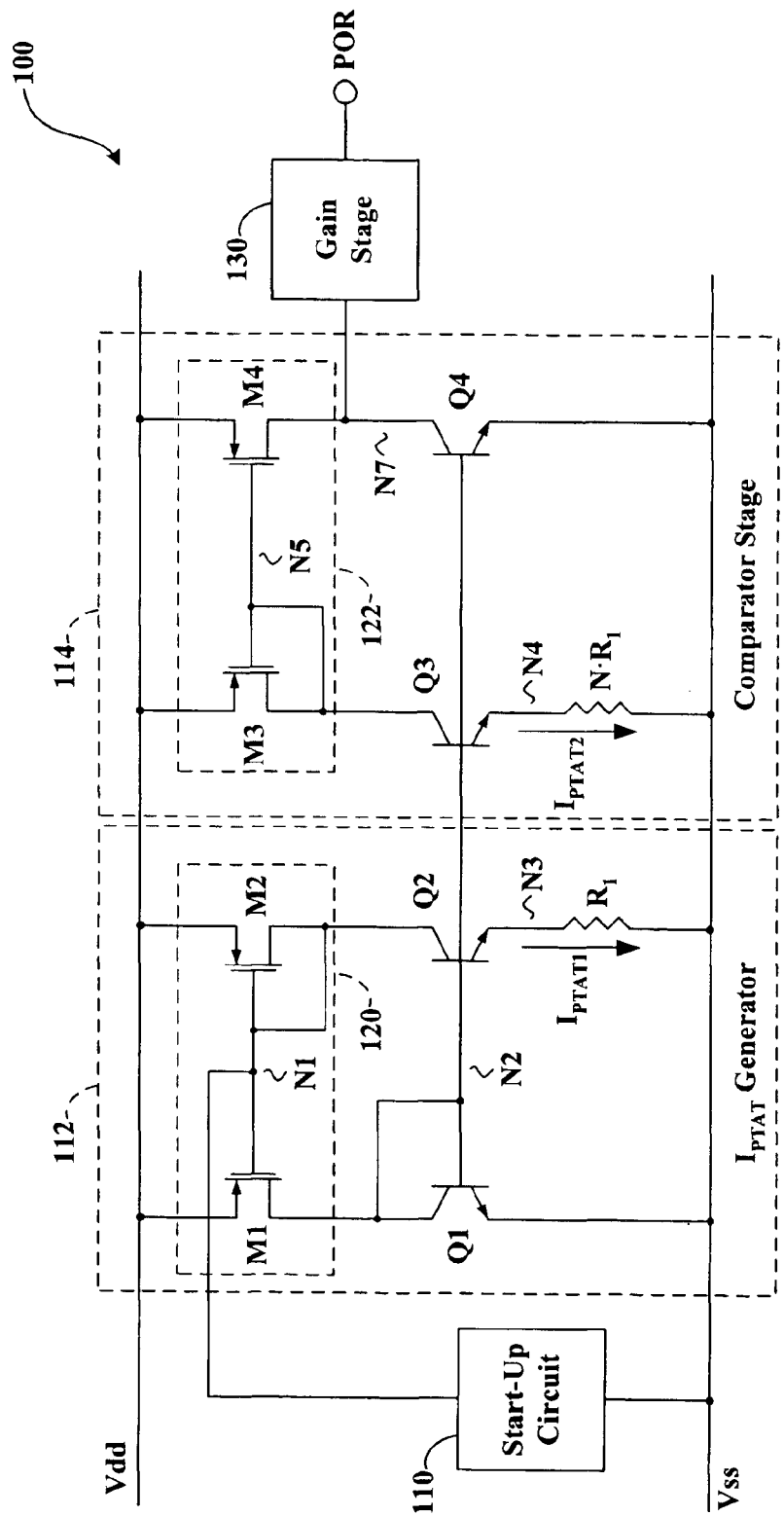
FIG. 1 illustrates a schematic diagram of an active power-on reset current comparator circuit.

FIG. 1 illustrates a schematic diagram of an active power-on reset (POR) current comparator circuit. The POR current comparator circuit (100) includes start-up circuit 110, $I_{PTAT}$ generator 112, comparator stage 114, and gain stage 130. $I_{PTAT}$ generator 112 (i.e., current generator 112) includes current mirror circuit 120, transistors Q1 and Q2, and resistance circuit $R_1$. Comparator stage 114 includes current mirror circuit 122, transistors Q3 and Q4, and resistance circuit $N \cdot R_1$. Current mirror circuit 120 includes transistors M1 and M2. Current mirror circuit 122 includes transistors M3 and M4.

Transistor M1 includes a source that is coupled to an upper voltage supply (Vdd), a gate that is coupled to node N1, and a drain that is coupled to node N2. Transistor M2 includes a source that is coupled to Vdd and a gate and drain that are coupled to node N1. Transistor M3 includes a source that is coupled to Vdd and a gate and drain that are coupled to node N5. Transistor M4 includes a source that is coupled to Vdd, a gate that is coupled to node N5, and a drain that is coupled to node N7. Transistor Q1 includes an emitter that is coupled to a lower voltage supply (Vss) and a base and collector that are coupled to node N2. Transistor Q2 includes an emitter that is coupled to node N3, a collector that is coupled to node N1, and base that is coupled to node N2. Transistor Q3 includes an emitter that is coupled to node N4, a collector that is coupled to node N5, and a base that is coupled to node N2. Transistor Q4 includes an emitter that is coupled to Vss, a collector that is coupled to node N7, and a base that is coupled to node N2. Resistance circuit $R_1$ is coupled between node N3 and Vss. Resistance circuit $N \cdot R_1$ is coupled between node N4 and Vss. Start-up circuit 110 is coupled between node N1 and Vss. Gain stage 130 is coupled between node N7 and the output (POR).

In operation, the POR circuit current comparator circuit (100) produces a POR signal for use in resetting logic devices and mask reference startup signals during the initial power supply ramp of an integrated circuit. Actuation of the POR signal is dependent on the ratios between the currents flowing through the resistance circuits $R_1$ and $N \cdot R_1$ (where N is a scaling factor). The current ($I_{PTAT1}$) flowing through resistance circuit $R_1$ may be determined at steady state according to the following voltage loop equations:

$$-V_{be1}+V_{be2}+I_{PTAT1}R_1=0 \qquad (1)$$

$$V_{be}=V_1 Ln(I_c/I_s) \qquad (2)$$

$$-V_1 Ln(I_{PTAT1}/I_s)+V_1 Ln(I_{PTAT1}/AI_s)=-I_{PTAT1}R_1 \qquad (3)$$

$$I_{PTAT1}=\frac{V_t Ln(A)}{R_1} \qquad (4)$$

wherein $V_{be}$ corresponds to the base-emitter voltage of the corresponding transistor, $V_1$ corresponds to the threshold voltage, and A corresponds to the ratio between emitter areas for transistors Q1 and Q2 (Q2/Q1).

Correspondingly, the current ($I_{PTAT2}$) flowing through resistance circuit N·R$_1$ may be expressed as follows:

$$I_{PTAT2} = \frac{V_t Ln(A)}{N \cdot R_1} \qquad (5)$$

By scaling N to be larger than 1, the POR signal actuates when the current flowing through resistance circuit N·R$_1$ is at approximately the level expressed in the following equation:

$$I_{PTAT2} = I_{PTAT1}\left(\frac{1}{N}\right) \qquad (6)$$

As presented in the preceding equation, the scaling factor (N) may be selected such that the POR signal is actuated at a selectable point (i.e., time interval or supply voltage level) during startup.

As voltage increases on Vdd, start-up circuit 110 continues to hold the gate voltages for transistors M1 and M2 at a low level. Once a selected voltage on Vdd is reached, start-up circuit 110 releases the gate voltages for transistors M1 and M2, activating $I_{PTAT}$ generator 112. As start-up circuit 110 disengages, low level currents are flowing throughout the entire circuit (100), while competing currents will be flowing through transistors M4 and Q4. Initially, the current ($I_{PTAT2}$) through transistor Q3 and resistance circuit N·R$_1$ is measurably higher than the current flowing through Q4. In one example, the emitter area for transistor Q1 corresponds to 1X, transistor Q2 to AX, transistor Q3 to AX, and transistor Q4 to 1X. The difference in emitter area between transistor Q3 and transistor Q4, results in a $V_{be}$ for transistor Q3 that is less than the $V_{be}$ for transistor Q4. The lower $V_{be}$ for transistor Q3 results in a small current ($I_{PTAT2}$) flowing through resistance circuit N·R$_1$, which is larger than the corresponding current flow in transistor Q4. This current ($I_{PTAT2}$) is mirrored by current mirror 122, to flow through transistor M4. Accordingly, the current through transistor M4 is also measurably higher than the current through transistor Q4, pulling the POR signal to a high logic level. As the current $I_{PTAT2}$ begins to ramp up, the current through transistor Q4 increases. At a selected bias current level, the current flowing through transistor Q4 surpasses the current flowing through Q3 and M4, pulling the POR signal to a low logic level. During a start-up cycle, the POR is initially pulled high, preventing instability of subsequent circuits (not shown), and then the POR circuit is pulled low, allowing subsequent circuitry to initiate at an acceptable bias current. The POR circuit remains low for the remainder of the operational range of the POR current comparator circuit (100).

In another embodiment, transistors Q3 and Q2 are not matched in size as described above. Instead, transistor Q3 may be made a 1X device, while proportionally reducing the size of resistance circuit N·R$_1$ (e.g., by 1/A) and transistor circuit Q4 (e.g., by 1/A).

In yet another embodiment, a transistor (not shown) is included to source more current into transistor Q4. When the POR signal is pulled to a low logic level, transistor Q4 saturates, resulting in base current injection back into $I_{PTAT}$ generator 112. This injection of base current may result in errors of regulation for $I_{PTAT}$ generator 112. An additional transistor sourcing more current into transistor Q4 prevents transistor Q4 from reaching saturation.

Figure 2:
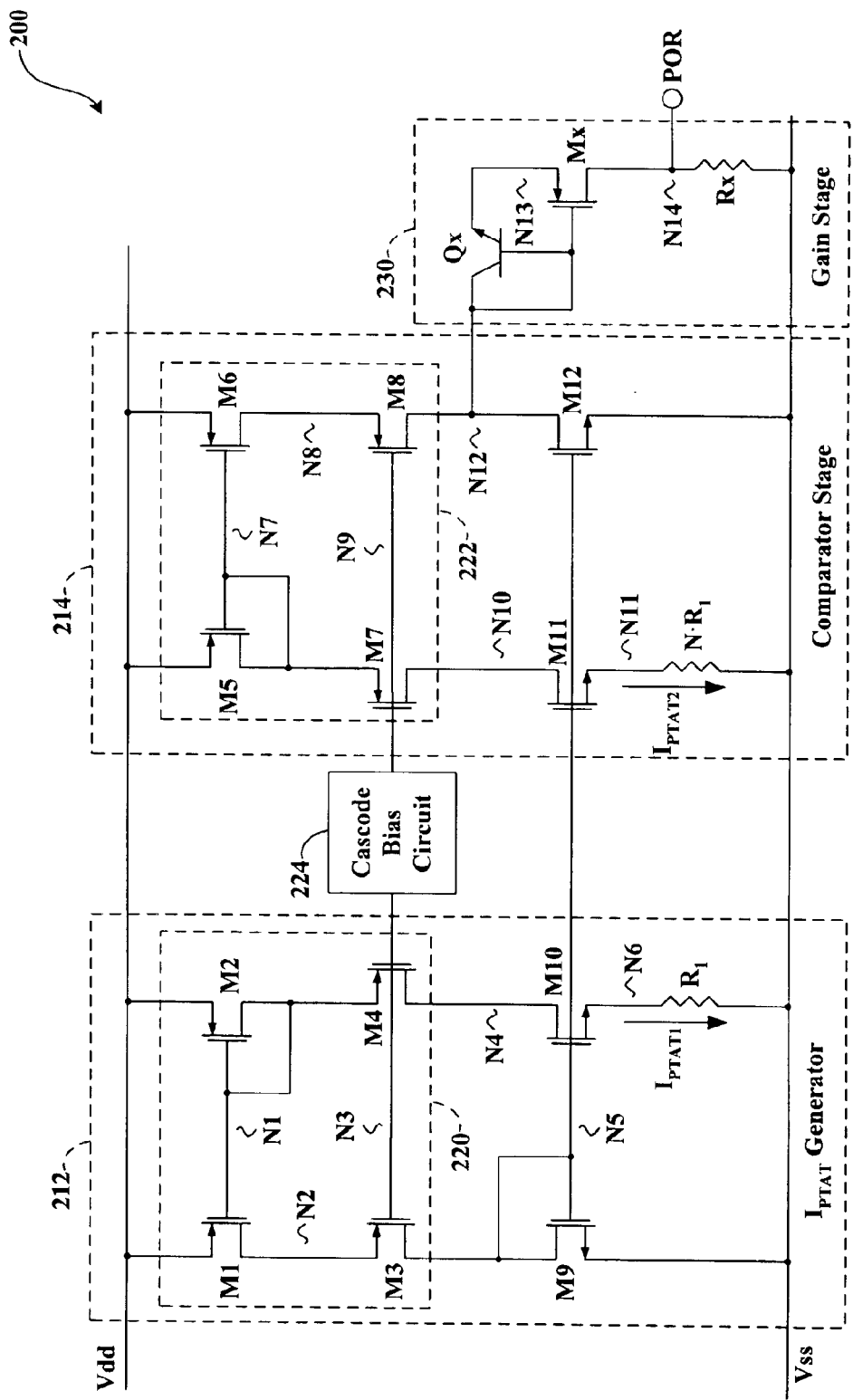
FIG. 2 illustrates a schematic diagram of another active power-on reset current comparator circuit.

FIG. 2 illustrates a schematic diagram of another active power-on reset (POR) current comparator circuit. The POR current comparator circuit (200) includes $I_{PTAT}$ generator 212, comparator stage 214, cascode bias circuit 224, and gain stage 230. $I_{PTAT}$ generator 212 includes current mirror circuit 220, transistors M9 and M10, and resistance circuit R$_1$. Comparator stage 214 includes current mirror circuit 222, transistors M11 and M12, and resistance circuit N·R$_1$. Current mirror circuit 220 includes transistors M1, M2, M3, and M4. Current mirror circuit 222 includes transistors M5, M6, M7, and M8. Gain stage 230 includes transistors Qx and Mx, and resistance circuit Rx.

Transistor M1 includes a source that is coupled to an upper voltage supply (Vdd), a gate that is coupled to node N1, and a drain that is coupled to node N2. Transistor M2 includes a source that is coupled to Vdd and a gate and drain that are coupled to node N1. Transistor M3 includes a source that is coupled to node N2, a gate that is coupled to node N3, and drain that is coupled to node N5. Transistor M4 includes a source that is coupled to node N1, a gate that is coupled to node N3, and a drain that is coupled to node N4. Transistor M5 includes a source that is coupled to Vdd and a gate and drain that are coupled to node N7. Transistor M6 includes a source that is coupled to Vdd, a gate that is coupled to node N7, and a drain that is coupled to node N8. Transistor M7 includes a source that is coupled to node N7, a gate that is coupled to node N9, and drain that is coupled to node N10. Transistor M8 includes a source that is coupled to node N8, a gate that is coupled to node N9, and a drain that is coupled to node N12. Transistor M9 includes a source that is coupled to a lower voltage supply (Vss) and a drain and gate that are coupled to node N5. Transistor M10 includes a source that is coupled to node N6, a drain that is coupled to node N4, and gate that is coupled to node N5. Transistor M11 includes a source that is coupled to node N11, a drain that is coupled to node N10, and a gate that is coupled to node N5. Transistor M12 includes a source that is coupled to Vss, a drain that is coupled to node N12, and a gate that is coupled to node N5. Resistance circuit R$_1$ is coupled between node N6 and Vss. Resistance circuit N·R$_1$ is coupled between node N11 and Vss. Cascode bias circuit 224 is coupled between node N3 and node N9.

In gain stage 230, transistor Qx includes a base and collector that are coupled to node N12, and an emitter that is coupled to node N13. Transistor Mx includes a source that is coupled to node N13, a gate that is coupled to node N12, and a drain that is coupled to node N14. Resistance circuit Rx is coupled between node N14 and Vss.

In operation, POR current comparator circuit 200 operates similarly to POR current comparator circuit 100 shown in FIG. 1. In the present embodiment, the BJT transistor (Q1–Q4) shown in FIG. 1 have been replaced by threshold FET transistors (M9–M12). In addition, different current mirrors (220, 222) are used in place of the current mirrors (120, 122) shown in FIG. 1. Current mirrors 220 and 222 are cascoded current mirrors that utilize an external cascode bias circuit (224). Also, gain stage 230 illustrates an exemplary gain stage for use with the present invention. In other embodiments, other gain stages may be utilized (e.g., the gain stage shown in FIG. 3), or the gain stage may be eliminated from the circuit.

Gain stage 230 includes a diode connected NPN transistor (Qx), a PMOS device (Mx), and a resistance circuit (Rx) to provide an inverting gain stage for the output of the POR signal. Transistor Qx is used to protect transistor Mx from an over-voltage that may occur at the voltage supply (Vdd). In an over-voltage condition does occur, transistor Qx prevents the gate of transistor Mx from increasing too high. In other embodiments, resistance circuit Rx may be replaced with a current source or diode connected circuit.

Figure 3:
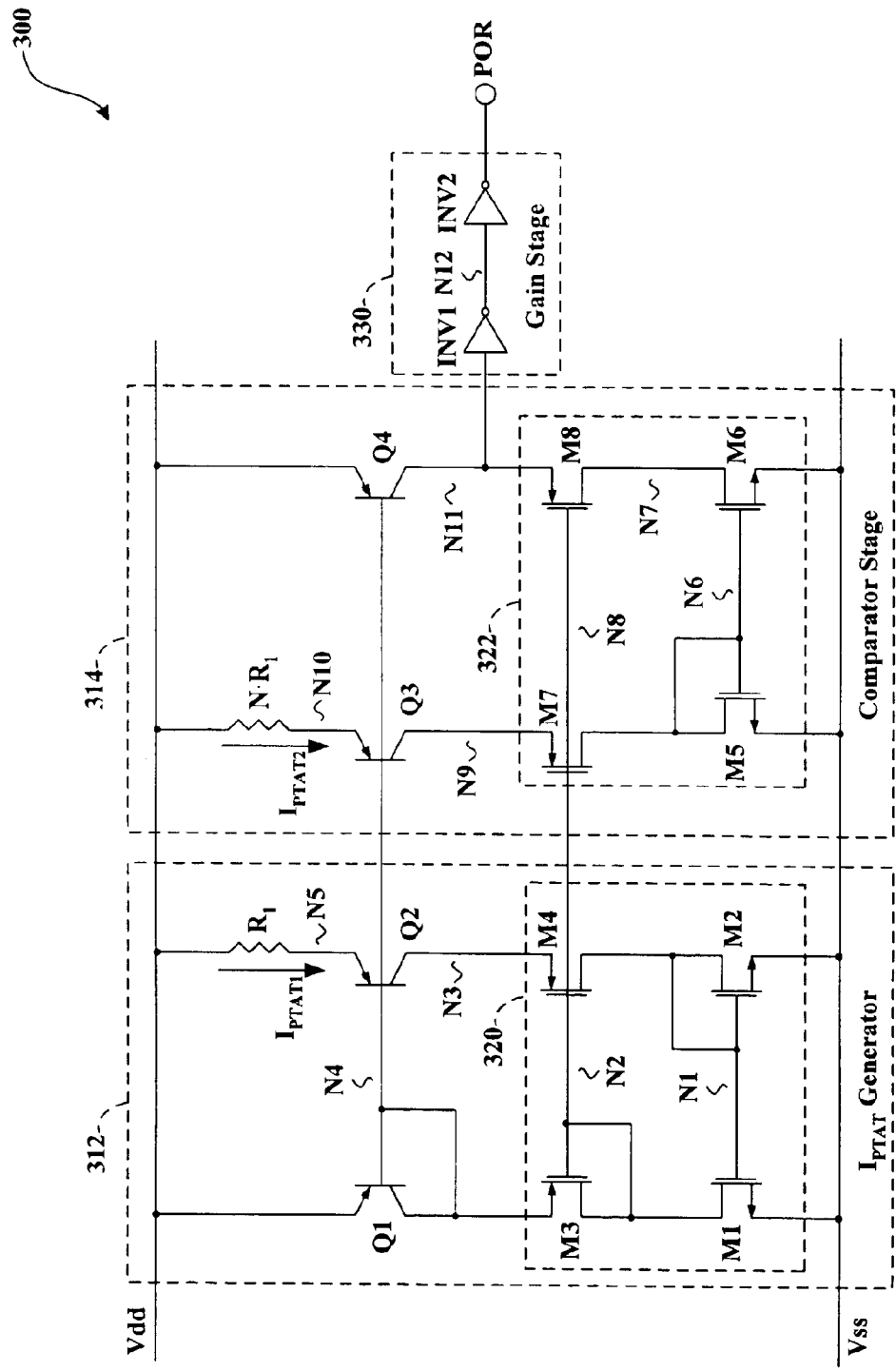
FIG. 3 illustrates a schematic diagram of a further active power-on reset current comparator circuit, in accordance with the present invention.

FIG. 3 illustrates a schematic diagram of a further active power-on reset (POR) current comparator circuit, in accordance with the present invention. The POR current comparator circuit (300) includes $I_{PTAT}$ generator 312, comparator stage 314, and gain stage 230. $I_{PTAT}$ generator 312 includes current mirror circuit 320, transistors Q1 and Q2, and resistance circuit $R_1$. Comparator stage 314 includes current mirror circuit 322, transistors Q3 and Q4, and resistance circuit $N \cdot R_1$. Current mirror circuit 320 includes transistors M1, M2, M3, and M4. Current mirror circuit 322 includes transistors M5, M6, M7, and M8. Gain stage 330 includes inverter circuits INV1 and INV2.

Transistor M1 includes a source that is coupled to a lower voltage supply (Vss), a gate that is coupled to node N1, and a drain that is coupled to node N2. Transistor M2 includes a source that is coupled to Vss and a gate and drain that are coupled to node N1. Transistor M3 includes a drain and gate that are coupled to node N2, and a source that is coupled to node N4. Transistor M4 includes a drain that is coupled to node N1, a gate that is coupled to node N2, and a source that is coupled to node N3. Transistor M5 includes a source that is coupled to Vss, and a gate and drain that are coupled to node N6. Transistor M6 includes a source that is coupled to Vss, a gate that is coupled to node N6, and a drain that is coupled to node N7. Transistor M7 includes a drain that is coupled to node N6, a gate that is coupled to node N2, and source that is coupled to node N9. Transistor M8 includes a drain that is coupled to node N7, a gate that is coupled to node N2, and a source that is coupled to node N11. Transistor Q1 includes an emitter that is coupled to an upper voltage supply (Vdd) and a base and collector that are coupled to node N4. Transistor Q1 includes an emitter that is coupled to node N5, a collector that is coupled to node N3, and base that is coupled to node N4. Transistor Q3 includes an emitter that is coupled to node N10, a collector that is coupled to node N9, and a base that is coupled to node N4. Transistor Q4 includes an emitter that is coupled to Vss, a collector that is coupled to node N11, and a base that is coupled to node N4. Resistance circuit $R_1$ is coupled between node N5 and Vss. Resistance circuit $N \cdot R_1$ is coupled between node N10 and Vss.

In gain stage 330, inverter circuit INV1 is coupled between node N11 and node N12. Inverter circuit INV2 is coupled between node N12 and the output (POR).

In operation, POR current comparator circuit 300 operates similarly to the POR current comparator circuits (100, 200) shown in FIGS. 1 and 2. In the present embodiment, the NPN BJT transistors (Q1–Q4) shown in FIG. 1 have been replaced by PNP BJT transistors (Q1–Q4). In addition, different current mirrors (320, 322) are used in place of the current mirrors (120, 122) shown in FIG. 1. Current mirrors 320 and 322 are self-biased cascoded current mirrors. Also, gain stage 330 illustrates another exemplary gain stage for use with the present invention. Gain stage 330 includes two inverter circuits INV1 and INV2. The inverter circuits (INV1, INV2) serve to clean up and provide gain to the POR signal. Two inverter circuits are illustrated, however, in other embodiments, any number of inverter circuits that provide the desired POR signal may be used.

In the above FIGS. (1–3), the circuit is shown as including a lower supply voltage (Vss). Vss is interchangeable with a ground connection and should not be construed as a limitation of the invention. In addition, the start-up circuit (110) shown in FIG. 1 may be used in FIG. 2, FIG. 3, and further embodiments without departing from the scope of the invention.

The above specification, examples and data provide a complete description of the manufacture, use, and composition of the invention. Since many embodiments of the invention can be made without departing from the spirit and scope of the invention, the invention resides in the claims hereinafter appended.

I claim:

1. An apparatus for producing a power-on reset signal, comprising:

a current generator circuit that includes a first resistance circuit coupled between a first node and a second node, wherein the current generator circuit is arranged to produce a first current at startup; and a comparator stage that is coupled to the current generator and includes a second resistance circuit coupled between the first node and a third node, wherein the comparator stage is arranged to compare a second current to a third current such that the power-on reset signal is actuated when the third current is greater than the second current, wherein at least one of the second current and the third current corresponds to the first current according to a specified ratio such that a point is selectable during startup at which the power-on reset signal is actuated.

2. The apparatus of claim 1, further comprising a start-up circuit that is coupled to the current generator, the start-up circuit being arranged to prevent the current generator from producing the first current until a selected supply voltage is reached.

3. The apparatus of claim 1, further comprising a gain stage that is coupled to the comparator stage, the gain stage being arranged to provide clean up and gain to the power-on reset signal.

4. The apparatus of claim 1, wherein the current generator further comprises:

a current mirror that is coupled to a voltage supply;

a first transistor that is coupled to the current mirror;

a second transistor that is coupled to the current mirror, the first resistance circuit, and the first transistor, wherein the first current is produced when the current mirror is activated and the first current flows through the resistance circuit.

5. The apparatus of claim 1, wherein the comparator stage further comprises:

a current mirror that is coupled to a voltage supply;

a first transistor that is coupled to the current mirror;

a second transistor that is coupled to the current mirror, the second resistance circuit, and the first transistor, wherein the second current flows through the second resistance circuit and the third current flows through the second transistor.

6. The apparatus of claim 1, wherein the second current is substantially equal to the first current multiplied by 1/N, wherein N is a sealing factor corresponding to a ratio of sizes between the first resistance circuit that is included in the current generator and the second resistance circuit that is included in the comparator stage.

7. The apparatus of claim 6, wherein the comparator stage is further arranged such that selecting the scaling factor results in a selection of the point during startup at which the power-on reset signal is actuated.

8. The apparatus of claim 1, wherein the specified ratio for selecting a point during startup at which the power-on reset signal is actuated is dependent on a ratio sizes for transistors that are included in the current generator and the comparator stage.

9. A method, comprising:
producing a first current at startup, wherein the first current flows across a first resistance circuit that is coupled between a first node and a second node;
producing a second current at startup, wherein the second current flows across a second resistance circuit that is coupled between the first node and a third node and the second current corresponds to the first current according to a specified ratio;
producing a third current at startup, wherein the third current corresponds to the first current;
comparing the third current to the second current; and
actuating a power-on reset signal in response to the comparison of the third current to the second current, wherein the point during startup at which the power-on reset signal actuates is dependent on the specified ratio between the first current and the second current.

10. The method of claim 9, further comprising preventing the first current from being produced at startup until a specified supply voltage is reached.

11. The method of claim 9, further comprising providing gain to the power-on reset signal prior to providing the power-on reset signal to subsequent circuitry.

12. The method of claim 9, wherein comparing the third current to the second current further comprises comparing the third current to a mirror of the second current.

13. The method of claim 9, wherein N is a scaling factor corresponding to a ratio equal to the first current multiplied by 1N, wherein N is a scaling factor corresponding to a ratio of sizes between the first resistance circuit and the second resistance circuit.

14. The method of claim 13, wherein selecting the scaling factor results in a selection of the point during startup at which the power-on reset signal is actuated.

15. The method of claim 9, wherein the specified ratio for selecting a point during startup at which the power-on reset signal is actuated is dependent on a ratio of sizes for transistors.

16. An apparatus, comprising:
means for producing a first current at startup, wherein the first current flows across a first resistance circuit that is coupled between a first node and a second node;
means for producing a second current at startup, wherein the second current flows across a second resistance circuit that is coupled between the first node and a third node and the second current corresponds to the first current according to a specified ratio;
means for producing a third current at startup, wherein the third current corresponds to the first current;
means for comparing the third current to the second current; and
means for actuating a power-on reset signal in response to the comparison of the third current to the second current, wherein the point during startup at which the power-on reset signal actuates is dependent on the specified ratio between the first current and the second current.

17. The apparatus of claim 16, further comprising means for preventing the first current from being produced at startup until a specified supply voltage is reached.

18. The apparatus of claim 16, further comprising means for providing gain to the power-on reset signal prior to providing the power-on reset signal to subsequent circuitry.

19. The apparatus of claim 16, wherein the second current is substantially equal to the first current multiplied by 1/N, wherein N is a scaling factor corresponding to a ratio of sizes between the first resistance circuit and the second resistance circuit.

20. The apparatus of claim 16, wherein the specified ratio for selecting a point during startup at which the power-on reset signal is actuated is dependent on a ratio of sizes for transistors.

* * * * *

UNITED STATES PATENT AND TRADEMARK OFFICE
CERTIFICATE OF CORRECTION

PATENT NO. : 6,879,194 B1
DATED : April 12, 2005
INVENTOR(S) : Caldwell

It is certified that error appears in the above-identified patent and that said Letters Patent is hereby corrected as shown below:

Column 2,
Line 43, after "the POR", delete "circuit".
Lines 56 and 65, please change "$V_1$" to -- $V_t$ --.
Line 58, please change "$V_1$" to -- $V_t$ -- in both occurrences.

Column 4,
Line 48, please change "transistor" to -- transistors --.
Line 59, please change "threshold" to -- sub-threshold --.
Line 63, please change "In" to -- If --.

Column 5,
Line 31, please change "Q1" to -- Q2 --.

Column 7,
Line 28, "N is a scaling factor corresponding to a ratio" should read -- the second current is substantially --.
Line 30, please change "1N" to -- 1/N --.

Signed and Sealed this

Twentieth Day of September, 2005

JON W. DUDAS
*Director of the United States Patent and Trademark Office*